United States Patent
Dixon et al.

(10) Patent No.: US 12,275,640 B2
(45) Date of Patent: Apr. 15, 2025

(54) METHOD FOR MANUFACTURING GRAPHENE

(71) Applicant: Paragraf Limited, Somersham (GB)

(72) Inventors: Sebastian Dixon, Somersham (GB); James Griffiths, Somersham (GB); Ross Matthew Griffin, Somersham (GB); Ivor Guiney, Somersham (GB); Simon Thomas, Somersham (GB)

(73) Assignee: Paragraph Limited, Somersham (GB)

( * ) Notice: Subject to any disclaimer, the term of this patent is extended or adjusted under 35 U.S.C. 154(b) by 443 days.

(21) Appl. No.: 17/685,882

(22) Filed: Mar. 3, 2022

(65) Prior Publication Data

US 2022/0332585 A1 Oct. 20, 2022

(30) Foreign Application Priority Data

Mar. 4, 2021 (GB) .................................. 2103041

(51) Int. Cl.
| | |
|---|---|
| *B32B 9/00* | (2006.01) |
| *C01B 32/186* | (2017.01) |
| *C23C 16/26* | (2006.01) |
| *C23C 16/46* | (2006.01) |

(52) U.S. Cl.
CPC ............ *C01B 32/186* (2017.08); *C23C 16/26* (2013.01); *C23C 16/466* (2013.01); *Y10T 428/30* (2015.01)

(58) Field of Classification Search
CPC ....... Y10T 428/30; B82Y 30/00; B82Y 40/00; C23C 16/26; C23C 16/466; C01B 32/186

USPC ........................................................ 428/408
See application file for complete search history.

(56) References Cited

U.S. PATENT DOCUMENTS

| | | | |
|---|---|---|---|
| 2011/0303899 A1 | 12/2011 | Padhi et al. | |
| 2013/0099195 A1* | 4/2013 | Seacrist | H01L 29/167 |
| | | | 977/734 |

FOREIGN PATENT DOCUMENTS

| | | |
|---|---|---|
| DE | 102013111791 A1 | 4/2015 |
| GB | 2570126 A | 7/2019 |
| WO | 2014110446 A2 | 7/2014 |
| WO | 2017029470 A1 | 2/2017 |

OTHER PUBLICATIONS

Great Britain Search Report, Appl. No. GB2103041.6, dated Aug. 18, 2021, 6 pages.

(Continued)

*Primary Examiner* — Daniel H Miller
(74) *Attorney, Agent, or Firm* — Stinson LLP (57) ABSTRACT

There is provided a method for manufacturing graphene, the method comprising: forming graphene on a non-metallic surface of a substrate by CVD in a CVD reaction chamber, wherein the step of forming graphene comprises introducing a precursor in a gas phase and/or suspended in a gas into the CVD reaction chamber; wherein the precursor consists of one or more compounds selected from a $C_4$-$C_{10}$ organic compound; wherein the organic compound is branched such that the organic compound has at least three methyl groups; and wherein the organic compound consists of carbon and hydrogen and, optionally, oxygen, fluorine, chlorine and/or bromine.

16 Claims, 3 Drawing Sheets (56) References Cited

OTHER PUBLICATIONS

Yan et al., "Synthesis of graphene: Potential carbon precursors and approaches," Nanotechnology Reviews, 2020, vol. 9, No. 1, pp. 1284-1314.
Saeed et al., "Chemical Vapour Deposition of Graphene-Synthesis, Characterisation, and Application: A Review," Molecules, 2020, vol. 25, No. 17, p. 3856.
Wang et al., "A review of graphene synthesis at low temperatures by CVD methods," New Carbon Materials, 2020, vol. 35, No. 3, pp. 193-208.
Rummeli et al., "Direct Low-Temperature Nanographene CVD Synthesis over a Dielectric Insulator," ACS Nano, 2010, vol. 4, No. 7, pp. 4206-4120.
Wuttke et al., "Direct Metal-Free Chemical Vapor Deposition of Graphene Films on Insulating Substrates for Micro-Supercapacitors with High Volumetric Capacitance," Batteries & Supercaps, 2019, vol. 2, pp. 929-933.

* cited by examiner

METHOD FOR MANUFACTURING GRAPHENE

REFERENCE TO RELATED APPLICATIONS

The present application claims the benefit of United Kingdom Application No. GB 2103041.6, filed Mar. 4, 2021, the entire contents of which are incorporated herein by reference.

FIELD OF THE INVENTION

The present invention provides a method for manufacturing graphene. More particularly, the present invention provides a method comprising forming graphene on a non-metallic surface of a substrate by CVD in a CVD reaction chamber wherein the precursor for graphene formation comprises an organic compound having at least three methyl groups.

BACKGROUND

Two-dimensional materials, of which graphene is one of the most prominent, are currently the focus of intense research. Graphene in particular has been shown, both theoretically and in recent years practically, to demonstrate extraordinary properties. The electronic properties of graphene are especially remarkable and have enabled the production of electronic devices which are orders of magnitude improved over non-graphene based devices. However, there remains a need in the art for methods which provide high-quality graphene, principally methods which enable the formation of graphene on non-metallic substrates suitable for direct use in manufacturing electronic devices thereby minimising and/or avoiding additional process steps which may otherwise contaminate the graphene.

It is known in the art that graphene may be synthesised, manufactured, formed, directly on non-metallic surfaces of substrates. These include silicon, sapphire and III-V semiconductor substrates. The present inventors have found that the most effective method for manufacturing high-quality graphene, especially directly on such non-metallic surfaces, is that disclosed in WO 2017/029470, and, for example, GB 2570126. This publication discloses methods for manufacturing graphene; principally these rely on heating a substrate held within a reaction chamber to a temperature that is within a decomposition range of a carbon based precursor for graphene growth, introducing the precursor into the reaction chamber through a relatively cool inlet so as to establish a sufficiently steep thermal gradient that extends away from the substrate surface towards the point at which the precursor enters the reactions chamber such that the fraction of precursor that reacts in the gas phase is low enough to allow the formation of graphene from carbon released from the decomposed precursor. Preferably the apparatus comprises a showerhead having a plurality of precursor entry points or inlets, the separation of which from the substrate surface may be varied and is preferably less than 100 mm. The method of WO 2017/029470 is ideally performed using an MOCVD reactor. Whilst MOCVD stands for metal organic chemical vapour deposition due to its origins for the purposes of manufacturing semiconductor materials such as AlN and GaN from metal organic precursors such as $AlMe_3$ (TMAl) and $GaMe_3$ (TMGa), such apparatus and reactors are well known and understood to those skilled in the art as being suitable for use with non-metal organic precursors. MOCVD may be used synonymously with metal organic vapour phase epitaxy (MOVPE).

Whilst the method of WO 2017/029470 enables the production of high-quality graphene with excellent uniformity and a constant number of layers (as desired) across its whole area on the substrate without additional carbon fragments or islands, the strict requirements in the art of electronic device manufacture means that there remains a need to further improve the electronic properties of the graphene and to provide methods that are more reliable and more efficient for the industrial manufacture of graphene, particularly large area graphene on non-metallic substrates.

DE 102013111791 A1 discloses the formation of graphene on a silicon dioxide substrate using a CVD reactor wherein a gaseous hydrocarbon is introduced into the process chamber, for example methane, ethane, propane or butane.

It is ubiquitous in the art to manufacture graphene from methane ($CH_4$). Methane represents the simplest precursor for graphene growth having a single carbon atom saturated with hydrogen. Methane is an abundant precursor available in suitably high purity for graphene growth. As a gaseous precursor, methane is particularly suitable for use in MOCVD apparatus as well as most other chemical vapour deposition apparatuses. For similar reasons, one of the other most common precursors for graphene growth is acetylene ($C_2H_2$).

Naturally, in view of the desire to discover improved methodologies for graphene growth, many other precursors have been studied. *Nanotechnology Reviews* 2020; 9: 1284-1314 "Synthesis of graphene: Potential carbon precursors and approaches" refers to a vast range of potential graphene precursors ranging from methane and other liquefied petroleum gases such as propane and butane, to more complex synthetic polymers and even "green" materials such as natural oils, biomass, glucose and waste lard. However, none of these have been shown to provide sufficient advantages so as to outperform the customary precursors like methane and acetylene. Where studied, the more typical gaseous and liquid organic precursor compounds, for example ethane, ethanol and benzene, have been used to study the mechanism of catalytic graphene formation on metallic substrates (such as Cu, Ni and Pt). In any event, this review acknowledges that "methane is most suited for the commercial manufacturing of graphene".

*Molecules* 2020, 25(17), 3856 "Chemical Vapour Deposition of Graphene-Synthesis, Characterisation, and Application: A Review" provides an overview of the leading CVD methods for graphene growth.

New Carbon Materials, 2020, 35(3): 193-208 "A review of graphene synthesis at low temperatures by CVD methods" provides a review of low temperature growth of graphene by CVD and discloses that the C—H bond energy is a key factor affecting graphene growth temperature and discloses the use of precursors such as ethane, acetylene, ethylene, and toluene, alongside the most commonly used precursor, methane.

WO 2014/110446 discloses a method for graphene formation by plasma enhanced CVD (PECVD) on copper substrates. A range of saturated and unsaturated hydrocarbon carbon sources are disclosed with the process exemplified using methane as a precursor, which is unsurprising in view of the state of the art, on a variety of copper substrates including high purity copper foil, common OFHC sheet, single crystal (100) copper substrates, and single crystal (111) copper substrates.

US 2011/303899 A1 discloses a method of graphene deposition as part of the back end of the line process (BEOL) wherein graphene is formed on metallic underlayers and not the surrounding dielectric materials. It is disclosed that a hydrocarbon such as $C_xH_y$ can be used, wherein $1 \leq x \leq 10$ and $2 \leq y \leq 20$. Acetylene is taught as a suitable precursor along with halogenated hydrocarbons such as $CCl_4$ can $CH_2I_2$.

*ACS Nano* 2010, 4, 7, 4206-4120 "Direct Low-Temperature Nanographene CVD Synthesis over a Dielectric Insulator" discloses the direct low-temperature synthesis of graphene by CVD on MgO using cyclohexane.

*Batteries & Supercaps* 2019, 2, 929-933 "Direct Metal-Free Chemical Vapor Deposition of Graphene Films on Insulating Substrates for Micro-Supercapacitors with High Volumetric Capacitance" discloses the formation of graphene directly on fused silica by LPCVD using propionic acid as a precursor.

SUMMARY OF THE INVENTION

The inventors developed the present invention with the aim to improve the process for manufacturing graphene, specifically for forming graphene on non-metallic surfaces, so as to provide high-quality graphene on substrates suitable for subsequent processing into electronic devices.

Accordingly, in a first aspect there is provided a method for manufacturing graphene, the method comprising:
- forming graphene on a non-metallic surface of a substrate by CVD in a CVD reaction chamber, wherein the step of forming graphene comprises introducing a precursor in a gas phase and/or suspended in a gas into the CVD reaction chamber;
- wherein the precursor consists of one or more compounds selected from a $C_4$-$C_{10}$ organic compound;
- wherein the organic compound is branched such that the organic compound has at least three methyl groups; and
- wherein the organic compound consists of carbon and hydrogen and, optionally, oxygen, fluorine, chlorine and/or bromine.

BRIEF DESCRIPTION OF THE DRAWINGS

The present invention will now be described further with reference to the following non-limiting Figures, in which.

DETAILED DESCRIPTION

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The present invention relates to a method for manufacturing graphene which is synonymous for synthesising, forming, producing and growing graphene. Graphene is a very well-known two-dimensional material referring to an allotrope of carbon comprising a single layer of carbon atoms in a hexagonal lattice. Graphene, as used herein, refers to one or more layers of graphene. Accordingly, the present invention relates to the formation of a monolayer of graphene as well as multilayer graphene (which may be termed a graphene layer structure). Preferably, graphene refers to a graphene layer structure having from 1 to 10 monolayers of graphene. In many subsequent applications, a monolayer of graphene on a substrate is particularly preferred. Accordingly, the graphene manufactured in the method disclosed herein is preferably monolayer graphene. Nevertheless, multilayer graphene is preferable for other applications and 2 or 3 layers of graphene may be preferred.

The method comprises forming graphene on a non-metallic surface of a substrate by chemical vapour deposition (CVD) in a CVD reaction chamber. This step of forming graphene comprises introducing a precursor in a gas phase and/or suspended in a gas into the CVD reaction chamber.

It is very common in the art to manufacture graphene using metal substrates since these are known to catalyse the decomposition of carbon-containing precursors and subsequent formation of graphene on the surface thereof. The most conventional catalytic metal substrate is copper, typically a copper foil, though other common metals include nickel, cobalt and platinum. The mechanism of graphene formation varies depending on the choice of catalytic metal; under some conditions carbon atoms are dissolved into the metal and on cooling the carbon returns to the surface and crystallise as graphene, whereas under other conditions nucleation and growth of graphene is dominated by surface diffusion of carbon atoms and adatoms. In both cases, chemisorption and dehydrogenation of the precursor by the catalytic metal liberates the free carbon atoms for graphene growth.

Conversely, the method disclosed herein requires the formation of graphene on a non-metallic surface of a substrate. The inventors have found that the precursors disclosed herein allow for the manufacture of graphene further improved over the prior art, including WO 2017/029470 (the contents of which are incorporated herein by reference) which discloses suitable methods for the production of graphene on non-metallic substrates. Preferably, the method disclosed herein is performed using the method disclosed in WO 2017/029470. Accordingly, the method of the present invention involves the formation of graphene directly on a non-metallic substrate without any transfer processes or steps.

WO 2017/029470 discloses that a precursor for graphene growth may include one or more compounds from any one or more of the groups: hydrocarbon, hydride, halocarbon, including haloalkane and haloamide, metallocene, metalorganic, amine including alkylamine, organic solvents and azo compounds, and also optionally azides, imides, sulphides and phosphides. From these groups, a precursor comprised from or consisting of one or more of bromomethane, methane, ethane, cyclopentadienylmagnesium, carbon tetrabromide, azomethane and/or acetylene are said to be most favoured. WO 2017/029470 specifically exemplifies the use of methane, bromomethane, carbon tetrabromide, cyclopentadienylmagnesium ($Cp_2Mg$) and ferrocene ($Cp_2Fe$) as precursors for graphene growth. Additionally, methane, ethane and acetylene are said to be favourable because they are commercially available in high purity form and have a molecular structure that comprises the wanted carbon; the other constituent, hydrogen, does not interfere with the graphene deposition process. Azo compounds such as azomethane and azoethane liberates nitrogen which does not interfere with the deposition process and are equally suitable. Halocarbons, in particular bromomethane, is said to be particularly favoured because its high volatility enables bromine to be removed under low pressure reaction conditions and bromine to be incorporated as a dopant under high pressure reaction conditions. The inventors have identified that branched organic compounds may be used in place of every precursor disclosed in WO 2017/029470 to advantageously improve the quality of the resulting graphene.

CVD refers generally to a range of chemical vapour deposition techniques, each of which involve vacuum deposition to produce thin film materials such as two-dimensional crystalline materials like graphene. Volatile precursors, those in the gas phase or suspended in a gas, are decomposed to liberate the necessary species to form the desired material, carbon in the case of graphene.

Preferably, the method involves forming graphene by thermal CVD such that decomposition is a result of heating the precursor. Preferably, the CVD reaction chamber used in the method disclosed herein is a cold-walled reaction chamber wherein a heater coupled to the substrate is the only source of heat to the chamber.

In a particularly preferred embodiment, the CVD reaction chamber comprises a close-coupled showerhead having a plurality, or an array, of precursor entry points. Such CVD apparatus comprising a close-coupled showerhead may be known for use in MOCVD processes. Accordingly, the method may alternatively be said to be performed using an MOCVD reactor comprising a close-coupled showerhead. In either case, the showerhead is preferably configured to provide a minimum separation of less than 100 mm, more preferably less than 25 mm, even more preferably less than 10 mm, between the surface of the substrate and the plurality of precursor entry points. As will be appreciated, by a constant separation it is meant that the minimum separation between the surface of the substrate and each precursor entry point is substantially the same. The minimum separation refers to the smallest separation between a precursor entry point and the substrate surface. Accordingly, such an embodiment involves a "vertical" arrangement whereby the plane containing the precursor entry points is substantially parallel to the plane of the substrate surface.

The precursor entry points into the reaction chamber are preferably cooled. The inlets, or when used, the showerhead, are preferably actively cooled by an external coolant, for example water, so as to maintain a relatively cool temperature of the precursor entry points such that the temperature of the precursor as it passes through the plurality of precursor entry points and into the reaction chamber is less than 100° C., preferably less than 50° C.

Preferably, a combination of a sufficiently small separation between the substrate surface and the plurality of precursor entry points and the cooling of the precursor entry points, coupled with the heating of the substrate to with a decomposition range of the precursor, generates a sufficiently steep thermal gradient extending from the substrate surface to the precursor entry points to allow graphene formation on the substrate surface. As disclosed in WO 2017/029470, very steep thermal gradients may be used to facilitate the formation of high-quality and uniform graphene directly on non-metallic substrates, preferably across the entire surface of the substrate. The substrate may have a diameter of at least 5 cm (2 inches), at least 15 cm (6 inches) or at least 30 cm (12 inches). Particularly suitable apparatus for the method described herein include an Aixtron® Close-Coupled Showerhead® reactor and a Veeco® TurboDisk reactor.

Consequently, in a particularly preferred embodiment wherein the method of the present invention involves using a method as disclosed in WO 2017/029470, the method comprises:

providing a substrate having a non-metallic surface on a heated susceptor in a close-coupled reaction chamber, the close-coupled reaction chamber having a plurality of cooled inlets arranged so that, in use, the inlets are distributed across the substrate and have constant separation from the substrate;

cooling the inlets to less than 100° C.;

introducing a precursor in a gas phase and/or suspended in a gas through the inlets and into the CVD reaction chamber to thereby decompose the precursor and form graphene on the non-metallic surface of the substrate; and heating the susceptor to a temperature of at least 50° C. in excess of a decomposition temperature of the precursor, to provide a thermal gradient between the substrate surface and inlets that is sufficiently steep to allow the formation of graphene from carbon released from the decomposed precursor;

wherein the constant separation is less than 100 mm, preferably less than 25 mm, even more preferably less than 10 mm.

Whilst the method may be carried out using any suitable CVD substrate having a non-metallic surface, it is preferred that the non-metallic surface of the substrate is silicon (Si), silicon carbide (SiC), silicon nitride ($Si_3N_4$), silicon dioxide ($SiO_2$), sapphire ($Al_2O_3$), aluminium gallium oxide (AGO) hafnium dioxide ($HfO_2$), zirconium dioxide ($ZrO_2$), yttria-stabilised hafnia (YSH), yttria-stabilised zirconia (YSZ), magnesium aluminate ($MgAl_2O_4$), yttrium orthoaluminate ($YAlO_3$), strontium titanate ($SrTiO_3$), cerium oxide ($Ce_2O_3$), scandium oxide ($Sc_2O_3$), erbium oxide ($Er_2O_3$), magnesium difluoride ($MgF_2$), calcium difluoride ($CaF_2$), strontium difluoride ($SrF_2$), barium difluoride ($BaF_2$), scandium trifluoride ($ScF_3$), germanium (Ge), hexagonal boron nitride (h-BN), cubic boron nitride (c-BN) and/or a III/V semiconductor such as aluminium nitride (AlN) and gallium nitride (GaN), for example silicon, silicon carbide, silicon oxide, silicon nitride, aluminium oxide, and/or a 111-V semiconductor. Such substrates are well known in the art and may consist of a single material (e.g. a sapphire wafer) or multiple materials (e.g. silicon dioxide, or any of the other materials, on silicon).

The inventors have found that when forming graphene directly on non-metallic substrates, precursors beyond the traditional hydrocarbons methane and acetylene allow for the formation of even higher quality graphene. In the present invention, the precursor consists of one or more compounds selected from a $C_4$-$C_{10}$ organic compound, wherein the organic compound is branched such that the organic compound has at least three methyl groups.

Whilst investigating the mechanism by which graphene is formed on non-metallic surfaces, the present inventors have surprisingly discovered that more complex precursors, but nevertheless small molecule and relatively volatile precursors, produced higher quality graphene. The precursors disclosed herein have allowed the inventors to manufacture graphene with reduced process times and at lower temperatures. For example, triptane can be used to produce equivalent graphene to hexane, but at a temperature of 50-100° C. lower. This has allowed for an increase in production efficiency and/or the option to form graphene on more thermally sensitive substrate surfaces such as in a back-end-of-line process. Thus, even though it is known in the art that a vast array of precursors may be used to form graphene, including by CVD, the present inventors have also overcome a prejudice in the art that is a reliance on simple molecules such as methane and acetylene to form graphene suitable for industrial applications such as electronic devices, particularly when seeking to manufacture monolayer graphene and/or large area graphene (i.e. across substrates of at least 15 cm in diameter).

The precursor for use in the method of the present invention consists of $C_4$-$C_{10}$ organic compounds. Preferably, the precursor consists of one organic compound as disclosed herein, nevertheless, mixtures of two or more compounds may equally be used to benefit from the present invention.

By an organic compound it is meant any chemical compound, or molecule, that contains a carbon-hydrogen covalent bond. As described herein, hydrocarbons, which consist of carbon and hydrogen, are particularly preferred. In some embodiments, the organic compounds may comprise heteroatoms such that the organic compounds consist of carbon and hydrogen, and one or more of oxygen, fluorine, chlorine and bromine. By $C_4$-$C_{10}$ it is meant that the organic compound contains from four to ten carbon atoms. Preferably, the organic compounds are $C_5$-$C_{10}$ organic compounds having from five to ten carbon atoms.

The $C_4$-$C_{10}$ organic compounds may optionally be substituted with oxygen, fluorine, chlorine and/or bromine. Accordingly, the organic compounds for use in the present method consist of carbon and hydrogen and, optionally, oxygen, fluorine, chlorine and/or bromine.

In one preferred embodiment, the organic compound includes one or more oxygen atoms, each oxygen atom linking two carbon atoms. In other words, the $C_4$-$C_{10}$ organic compound may be a $C_4$-$C_{10}$ ether comprising from four to ten carbon atoms and one or more ether oxygen atoms (and having at least three methyl groups). In another preferred embodiment, the organic compound has one or more functional groups selected from a hydroxy group (—OH), a fluorine atom (—F), a chlorine atom (—Cl) and a bromine atom (—Br).

The branched pentane isomer 2,2-dimethylpropane is a suitable $C_5$ hydrocarbon precursor having four methyl groups (i.e. $(CH_3)_3$—C—$CH_3$). Replacement of one methyl group with a hydroxy group affords t-butanol (($CH_3)_3$—C—OH) which is a $C_4$ organic compound having three methyl groups and is also a suitable precursor.

Preferably, only organic compounds wherein there are no bonds between oxygen atoms and other oxygen or halogen atoms (when these atoms are present) may be used in the present invention due to the relative instability of —O—O— bonds and —O—X bonds. Preferably, compounds comprising carbonyl groups are excluded. This is because —C(=O)— groups increase the molecular weight of the precursor unnecessarily thereby having reduced volatility and a reducing the availability for branching which is needed to provide the three essential methyl groups.

When the organic compound comprises such heteroatoms and functional groups, it is particularly preferred that the organic compounds comprises only up to two heteroatoms of oxygen, fluorine, chlorine and/or bromine. Even more preferably, the organic compound comprises only one heteroatom since multiple functionalities typically result in more complex organic compounds (e.g. when compared to simple hydrocarbons such as alkanes, monoalcohols or monohalogenated compounds). As a consequence, such precursors may be more expensive and/or less readily commercially available, particularly in combination with the necessity for the organic compound to be branched to have at least three methyl groups.

The use of a precursor comprising an oxygen, fluorine, chlorine or bromine heteroatom allows for the manufacture of doped graphene. Due to its properties, doped graphene may be advantageous for certain applications. In some embodiments, particularly when an oxygen atom is introduced, the resulting organic compound is an alcohol or an ether and such organic compounds are abundant and readily commercially available. Enols (i.e. alkenols; alkenes with an alpha hydroxyl group), acetals (i.e. RHC(OR)$_2$) and ketals (i.e. R$_2$C(OR)$_2$) can be unstable and are instead typically found in their isomerised ketone (or aldehyde) form. As described herein, in this case when the organic compound comprises —OH, the organic compound is preferably saturated. Where the organic compounds comprise an ether oxygen, it is preferred that the organic compound does not comprise an acetal or ketal. Similarly, suitable halogenated compounds are less common and can be more expensive and in some cases, halogenated alcohols can be reactive and toxic. Accordingly, it is preferred that the organic compounds from which the precursor is selected are hydrocarbons, halogenated hydrocarbons, alcoholic hydrocarbons and ethereal hydrocarbons having only one class of functional group.

Preferably, the precursor is a liquid when measured at 20° C. and 1 bar of pressure (i.e. under standard conditions according to IUPAC). Accordingly, the precursor has a melting point that is below 20° C., preferably below 10° C., and has a boiling point above 20° C., preferably above 30° C. Liquid precursors are simpler to store and handle when compared to gaseous precursors which typically require high pressure cylinders. Due to their relatively reduced volatility when compared to gaseous precursors, they present a lower safety risk during large scale manufacture. Increasing the molecular weight of the compounds beyond $C_{10}$ typically reduces their volatility and suitability for CVD growth of graphene on non-metallic substrates (though graphene can be produced from solid organic compounds).

Without wishing to be bound by theory, the inventors believe that heavier organic compounds (i.e. those greater than $C_{10}$ and/or those which are solid under standard conditions) provide a "less pure" source of $CH_3$ radicals. With an increase in size and complexity of the organic compound there is an increase in the number of decomposition pathways and the possibility of a greater range of byproducts which can lead to graphene defects. The organic compounds as described herein provide a balance of being large enough to deliver the required, and a desirably high fraction of, methyl groups under pyrolysis. The organic compounds are however small enough to be simple to purify, particularly where the precursor is liquid, and have a relatively simple pyrolysis chemistry with limited decomposition pathways. Furthermore, unlike heavier compounds, they do so not readily condense within the reactor plumbing which is a particular disadvantage for the industrial production of graphene due to the greater risk of reactor downtime.

Preferably, the organic compounds are saturated and/or acyclic. Such compounds are typically more readily available, cheaper and less likely to degrade with storage over time. By saturated, it is meant that the organic compound consists of single covalent bonds. Cyclic and acyclic are common terms in the art and referring to the presence, or lack of, a series of atoms connected to form a ring.

The organic compounds are branched such that the organic compounds have at least three methyl groups. Unlike straight chain organic compounds which are usually based on secondary carbon atoms (i.e. $R_2CH_2$) covalently bonded to two hydrogen atoms and two further carbon atoms in the chain, branched organic compounds comprise at least one tertiary carbon atom (i.e. $R_3CH$) or at least one quaternary carbon atom (i.e. $R_4C$). Straight chains may also result from the presence of alkenic (i.e. $Y_2C=CY_2$) groups and necessarily result from alkylenic (i.e. $YC\equiv CY$) groups. A straight chain hydrocarbon may be terminated with at both ends by primary carbon atoms (i.e. $RCH_3$). A tertiary carbon atom introduces a branch into the chain of the organic compound and a quaternary carbon atom introduces two branches thereby increasing the number of possible terminal methyl groups. Similarly, an alkenic carbon—carbon double bond may introduce one or two branches, depending on the nature of the substitution (i.e. the Y group).

The present inventors have found that the use of branched organic compounds, specifically those which as a result comprise at least three methyl groups, improves the CVD process and the quality of graphene formed directly on non-metallic surfaces of substrates. Without wishing to be bound by theory, the inventors have discovered that organic compounds which decompose to liberate methyl radicals facilitate the formation of graphene on non-metallic surfaces. The inventors have found that the formation of methyl radicals is preferable to other carbon based intermediate decomposition products and such a mechanistic pathway of decomposition accelerates graphene formation.

This is believed to be result from the stability of the methyl radical ($—CH_3$) under the growth conditions relative to other intermediate species such as methylidene (i.e. methylene, carbene, $—CH_2$) and methylidyne (i.e. carbyne, $—CH$) radicals. When growing graphene on non-metallic surfaces, methyl radicals are believed to release carbon atoms for forming graphene more readily. The high reactivity of the latter radicals can result in recombination in the gas phase and the formation of low molecular weight highly volatile carbon species (e.g. ethylene, $H_2C=CH_2$). Under the prevailing conditions employed for decomposition of a branched organic compound, the recombined species are more stable and fail to decompose to liberate carbon. Preferably, they are eventually removed from the reaction chamber under vacuum. Alternatively, the highly reactive intermediates instead cluster to form species which are detrimental to the growth of graphene on the substrate surface. The inventors have found that organic compounds with a greater number of methyl groups are less likely to introduce point defects into the graphene. Such defects can result in an increase in electron scattering which in turn leads to the graphene being less conductive. The point defects can also add to the sheet carrier concentration (such as where the defects are non-$sp^2$ carbon). By minimising undesirable decomposition pathways through the use of organic compounds as described herein, the inventors have been able to produce higher quality graphene and with greater efficiency.

By extension, it has been found to be preferable that the organic compounds have at least four or even at least five methyl groups. It is also preferable that the precursor consists of one or more compounds selected from a $C_6$-$C_{10}$ organic compound, particularly wherein the $C_6$-$C_{10}$ organic compounds have at least five methyl groups. Similarly, the organic compound is preferably a $C_4$-$C_9$, $C_4$-$C_8$, $C_5$-$C_9$, $C_5$-$C_8$, $C_6$-$C_9$, $C_6$-$C_8$ and most preferably a $C_6$-$C_7$ organic compound.

In a preferred embodiment, the organic compounds are hydrocarbons. The hydrocarbons are preferably saturated hydrocarbons, i.e. alkanes. A particularly preferred acyclic hydrocarbon is the 07 hydrocarbon triptane (i.e. 2,2,3-trimethylbutane). Nevertheless, the hydrocarbons may be alkenes and/or alkynes. Accordingly, the hydrocarbons may comprise an aromatic benzene ring formally having three alkene groups, however, the organic compounds preferably will have only one or two alkene and/or alkyne groups, preferably one alkene or alkyne group.

In other words, the precursor preferably consists of one or more alkanes of the formula $C_nH_{2n+2}$ wherein n is from four to ten, or as described above in respect of the number of carbon atoms. It is also preferred that n is at most eight. Organic compounds, particularly alkenes and alkynes, may also have the more general formula $C_nH_{2y}$ wherein n is from six to ten, and y is an integer such that $5 \le y \le n$ (a minimum of five results from the requirement for at least three methyl groups).

Alkanes are preferred as they are generally more readily available in good purity and have greater chemical stability due to the absence of unsaturated and/or heteroatomic functional groups. Similarly, it is preferred that the alkanes are acyclic.

Preferably, the precursor comprises a branched organic compound having at least one tertiary carbon atom and/or at least one quaternary carbon atom, preferably at least two tertiary and/or quaternary carbon atoms. As will be appreciated, an optionally substituted organic compound as described herein having branching such that at least three methyl groups are present will require the presence of a tertiary or quaternary carbon atom or a tri- or tetra-substituted alkene (the former resulting in branching through saturated carbon atoms and the latter through unsaturated carbon atoms).

It is preferred that the organic compounds comprise at least one of a tertiary carbon atom (i.e. an $sp^3$ hybridised carbon atom having three covalently bonded non-hydrogen atoms) and a quaternary carbon atom (i.e. an $sp^3$ hybridised carbon atom having four covalently bonded non-hydrogen atoms). The non-hydrogen atoms here are either carbon or an ether oxygen to provide the necessary catenation since an alcohol or halogen terminates the chain and therefore fails to allow for further methyl groups from the branch. A carbon atom is a preferred non-hydrogen atom (since hydrocarbons are preferable organic compounds) and it is preferable that the non-hydrogen atom is another $sp^3$ hybridised carbon atom since these are generally weaker than $sp^3$-$sp^2$ carbon-carbon bonds. A quaternary carbon atom is preferred since this allows for further branching from a single carbon atom which enables the provision of further methyl groups further improving the atom efficiency of graphene production. As a result, it is also preferred that the organic compounds have at least two of these branching carbon atoms whether it be at least two tertiary carbon atoms, at least two quaternary carbon atoms or at least one tertiary and one quaternary carbon atom. Where the organic compound is branched as a result of the presence of an alkene, the alkene will have at least three substituents (i.e. $RHC=CR_2$), preferably four substituents (i.e. $R_2C=CR_2$). As with the tertiary and quaternary carbon atoms described above, the substituents are not an alcohol or a halogen atom but rather an ether oxygen or a further carbon chain.

Preferably, the precursor consists of one or more compounds selected from a $C_5$-$C_{10}$ organic compound, and even more preferably a $C_5$-$C_8$ organic compound. In this embodiment, the organic compound has at least one tertiary carbon atom and/or at least one quaternary carbon atom, even more preferably at least two tertiary and/or quaternary carbon atoms as described above. In other words, the precursor preferably consists of organic compounds having tertiary and/or quaternary carbon atoms.

The organic compounds may also be described with reference to the ratio of methyl carbon atoms (primary carbon atoms) to non-hydrogen atoms (i.e. the sum of non-methyl carbons (non-primary carbon atoms), and when present, oxygen, fluorine, chlorine and bromine atoms). Such a ratio may be used to indicate the extent of branching in an organic compound as described herein. Preferably, the ratio of methyl carbon atoms to non-hydrogen atoms is from 3:7 to 4:1. For example, the ratio may be at least 1:2, preferably at least 1:1, more preferably at least 2:1. Such ratios increase the density of methyl groups per molecule increasing the atom efficiency of the decomposition. Nevertheless, there are practical limitations on the extent of branching within an organic compound such that the ratio may preferably be at most 3:1. Increased branching can result in compounds which are more difficult to synthesise and which are therefore less readily commercially available or are more expensive. Accordingly, the ratio may preferably be from 1:1 to 4:1, 1:2 to 3:1, 1:1 to 3:1, or 2:1 to 3:1.

In a particularly preferred embodiment, the precursor consists of one organic compound. By using only a single precursor having known characteristics (e.g. melting point/boiling point/volatility/decomposition temperature), the large scale industrial production of graphene is more efficient and reliable.

In a preferred embodiment of the present invention, the precursor is introduced into the CVD reaction chamber as a mixture with a carrier gas. Carrier gases are well known in the art and may also be referred to as a dilution gas or a diluent. Carrier gases typically include inert gases such as noble gases, and in the case of graphene growth, hydrogen gas. Accordingly, the carrier gas is preferably one or more of hydrogen ($H_2$), nitrogen ($N_2$), helium (He), and argon (Ar). More preferably the carrier gas is one of nitrogen, helium and argon or the carrier gas is a mixture of hydrogen and one of nitrogen, helium and argon.

The method of the present invention has enabled the inventors to manufacture graphene with a number of improvements over the prior art. The graphene produced by the present method, particularly undoped graphene produced from a hydrocarbon precursor, has fewer defects which gives rise to greater electron mobility and a "purer" graphene. Therefore, in a further aspect there is provided a substrate having a non-metallic surface, the substrate further comprising graphene on the non-metallic surface, the substrate having graphene thereon being obtainable by the method described herein, and preferably obtained by the method described herein.

The method of the present invention allows for the formation of graphene having improved electronic properties directly on non-metallic surfaces of substrates. For example, the low charge carrier concentration and/or high electron mobility renders the substrate having graphene thereon particularly suited for application in wide range of electronic devices. The improved electronic properties serve to increase the sensitivity of certain devices, for example Hall-sensors, which rely on charge neutral graphene which is preferably graphene having a low charge carrier density such as less than $5\times10^{12}$ $cm^{-2}$, less than $2\times10^{12}$ $cm^{-2}$, or preferably less than $1\times10^{12}$ $cm^{-2}$. Examples of other suitable electronic devices which can be improved through use of a substrate having graphene thereon obtainable by the method disclosed herein include, biosensors, transistors and electro-optic modulators.

In another aspect, there is provided a method for manufacturing graphene, the method comprising:
  forming graphene on a non-metallic surface of a substrate by CVD in a CVD reaction chamber, wherein the step of forming graphene comprises introducing a precursor in a gas phase and/or suspended in a gas into the CVD reaction chamber;
  wherein the precursor consists of one or more compounds selected from a $C_4$-$C_{10}$ organic compound;
  wherein the organic compound is branched such that the organic compound has at least three methyl groups.

In one preferred embodiment, the organic compound consists of carbon, hydrogen and nitrogen and, optionally, oxygen, fluorine, chlorine and/or bromine. Even more preferably, the organic compound consists of carbon, hydrogen and nitrogen. In an equivalent manner to the other aspects of the invention, the nitrogenous organic compound having from four to ten carbon atoms is preferably acyclic and/or preferably saturated, whilst having at least three methyl groups. Preferably, the organic compound comprises one or two nitrogen atoms. Similarly, the nitrogen is preferably a tertiary amine nitrogen since this facilitates the branching of the organic compound thereby increasing the number of possible terminal methyl groups.

Figure 1:
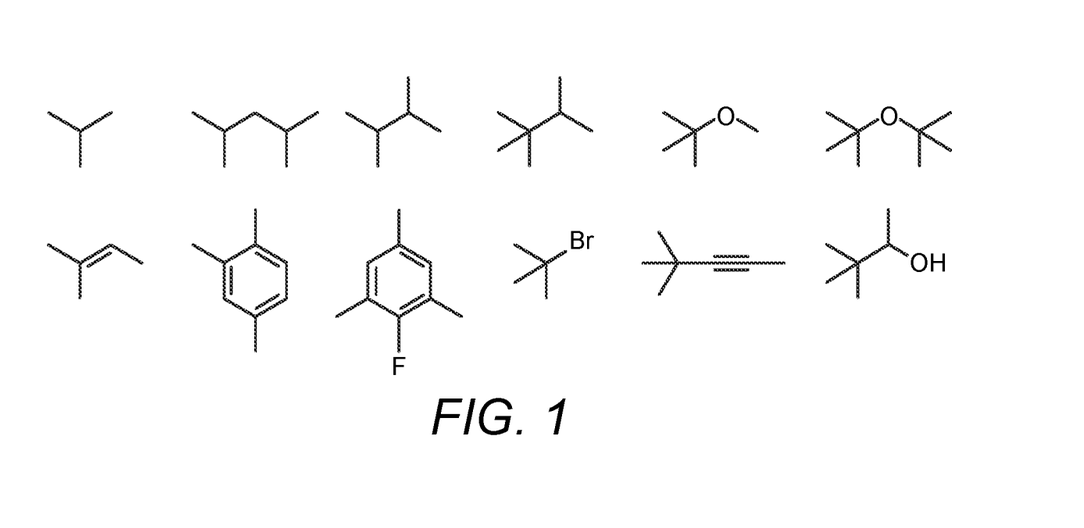
FIG. 1 is a selection of twelve different exemplary organic compounds suitable for use as precursors for graphene growth in the method according to the present invention.

The present invention will now be described further with reference to the following non-limiting Figures, in which:

FIG. 1 is a selection of twelve different exemplary organic compounds suitable for use as precursors for graphene growth in the method according to the present invention.

Figure 2:
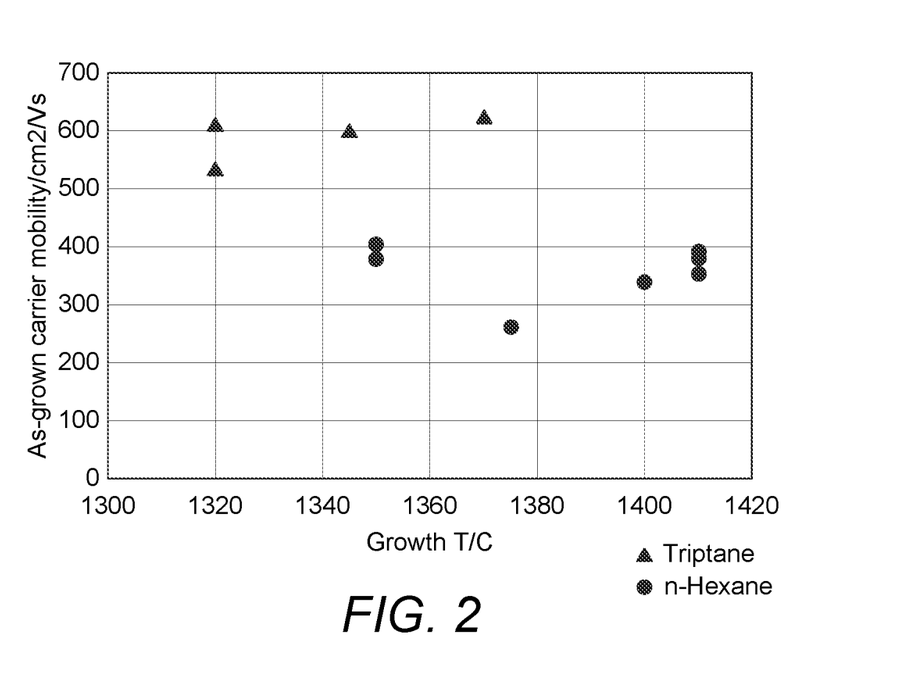
FIG. 2 shows the results of carrier mobility measurements on graphene produced using the branched and linear hydrocarbon precursors triptane and n-hexane, when grown at various growth temperatures.

FIG. 2 shows the results of carrier mobility measurements on graphene produced using the branched and linear hydrocarbon precursors triptane and n-hexane, when grown at various growth temperatures.

Figure 3A:
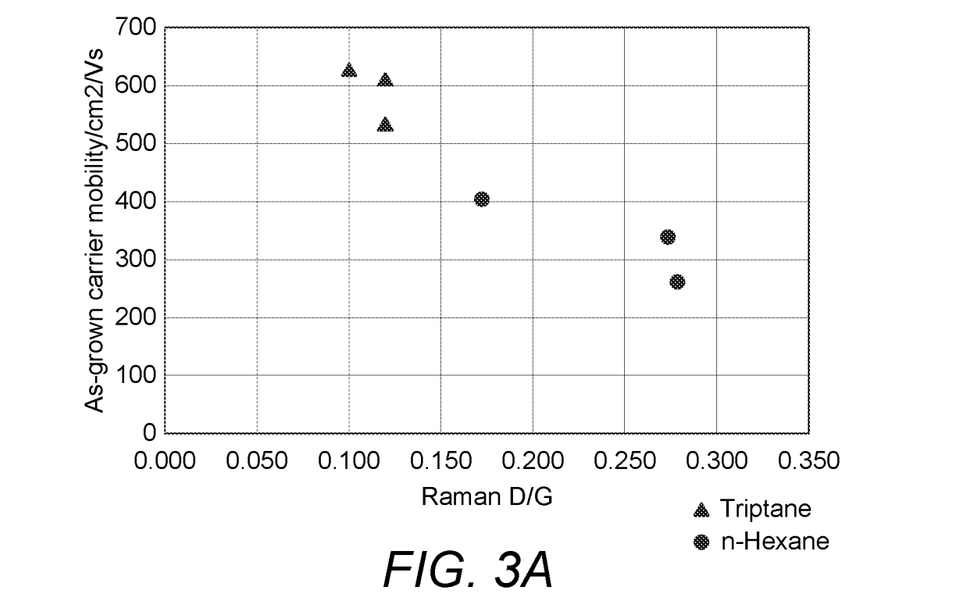
FIGS. 3A and 3B show the results of Raman and carrier mobility measurements on graphene produced using the branched and linear hydrocarbon precursors triptane and n-hexane.
Figure 3B:
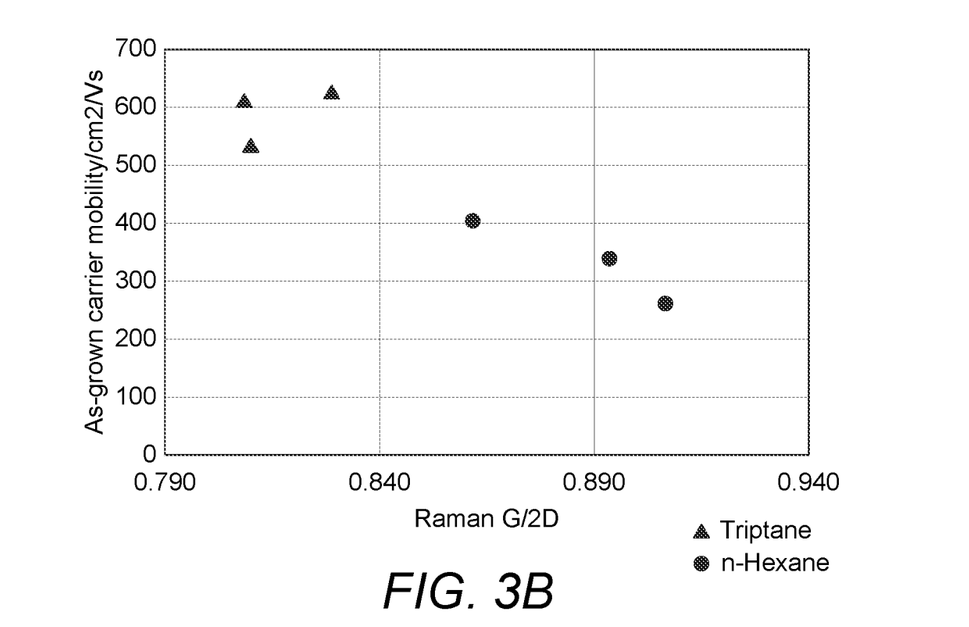

FIGS. 3A and 3B show the results of Raman and carrier mobility measurements on graphene produced using the branched and linear hydrocarbon precursors triptane and n-hexane.

Figure 4:
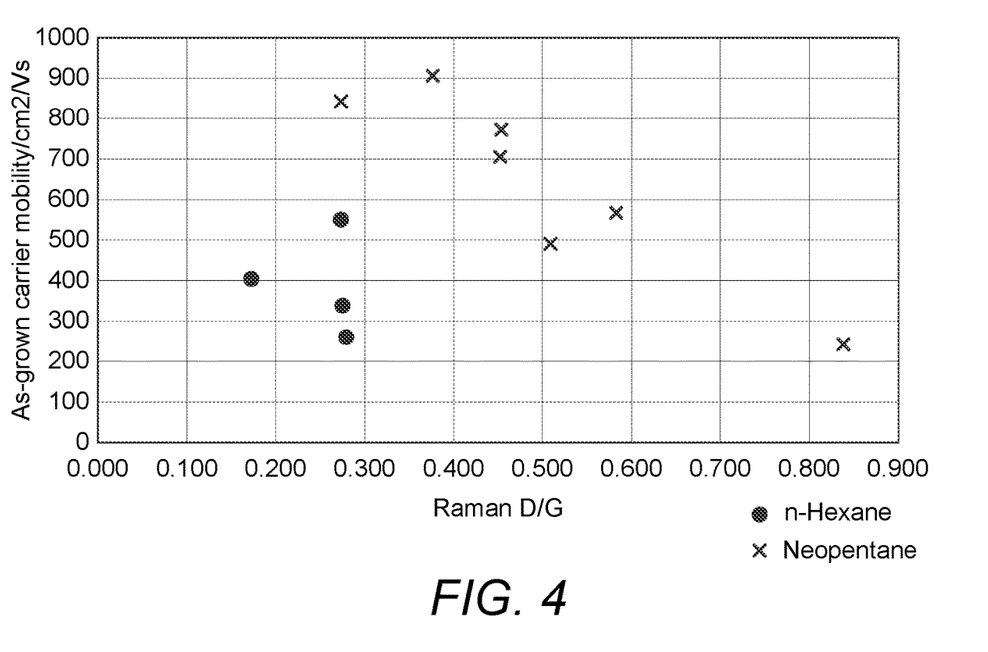
FIG. 4 shows the results of carrier mobility measurements on graphene produced using the branched and linear hydrocarbon precursors neopentane and n-hexane.

FIG. 4 shows the results of carrier mobility measurements on graphene produced using the branched and linear hydrocarbon precursors neopentane and n-hexane.

FIG. 1 illustrates the chemical structures of a variety of organic compounds suitable for use in the present invention. One example is isobutane (i.e. 2-methylpropane; $HC(CH_3)_3$) which is a $C_4$ organic compound. Due to its low molecular weight and lack of functional groups, isobutane is gaseous under standard conditions. Other suitable liquid hydrocarbons, specifically alkanes, include isopentane (i.e. 3-methylbutane; $(CH_3)_2CH(CH_2CH_3)$), 2,3-dimethylbutane $((CH_3)_2CHCH(CH_3)_2)$ and 2,2,3-trimethylbutane $((CH_3)_3CCH(CH_3)_2)$. These represent $C_5$, $C_6$ and $C_7$ alkanes that are liquid under standard conditions having three, four and five methyl groups, respectively.

Other organic compounds as illustrated by FIG. 1 includes alkenes. One example is the $C_5$ alkene amylene (i.e. 2-methylbut-2-ene; $(CH_3)_2C=CH(CH_3)$). Other liquid alkene hydrocarbons include aromatic hydrocarbons such as mesitylene. FIG. 1 illustrates one mesitylene isomer (i.e. 1,2,4-trimethylbenzene) which is a common organic solvent and therefore readily available and a cheap organic precursor. Another $C_9$ aromatic precursor illustrated in FIG. 1 is a substituted or functionalised mesitylene (i.e. 2-fluoro-1,3,5- trimethylbenzene). Another halogenated precursor includes the $C_4$ halogenated hydrocarbon tert-butyl bromide (i.e. 2-bromo-2-methylpropane; $(CH_3)_3CBr$) which provides three methyl groups.

Suitable hydrocarbons also include alkynes such as 4,4-dimethyl-2-pentyne $((CH_3)_3C-C\equiv C-(CH_3))$ which is a $C_7$ hydrocarbon having four methyl groups.

Other suitable organic compounds are ethers and alcohols. Two suitable ethers which are common as organic solvents and therefore readily available are methyl tert-butyl ether (i.e. 2-methoxy-2-methylpropane; $(CH_3)_3COCH_3$) and di-tert-butyl ether (i.e. 2-tert-butoxy-2-methylpropane; $((CH_3)_3C)_2O$). These represent $C_5$ and $C_8$ organic compounds with four and six methyl groups, respectively, having formally replaced the methylene ($-CH_2-$) of equivalent hydrocarbons with an oxygen ($-O-$), specifically of 2,2-dimethylbutane and 2,2,4,4-tetramethylpentane which are themselves suitable hydrocarbons. Finally, one example of a suitable alcohol includes pinacolyl alcohol (i.e. 3,3-dimethyl-2-butanol; $(CH_3)_3CCH(OH)(CH_3)$), a $C_6$ alcohol having three methyl groups though many other alcohols are well known common organic solvents and are readily available to be used in accordance with the present invention as precursors for graphene growth.

FIG. 2 is a plot of the measured carrier mobility of various samples of graphene versus its growth temperature, using either triptane (2,2,3-trimethylbutane) or n-hexane as a precursor. FIG. 2 demonstrates that graphene grown using triptane exhibits a high carrier mobility than graphene grown using n-hexane, even at lower growth temperatures.

FIG. 3A is a plot of the measured carrier mobility of various samples of graphene versus the ratio D/G obtained from its Raman spectrum. The D band is also known as the disorder band or the defect band in graphene. The G band is a sharp band characteristic of graphene. Accordingly, higher quality graphene exhibits and lower D/G ratio (defect ratio). FIG. 3B is an equivalent plot of carrier mobility versus the ratio G/2D (structure ratio).

FIG. 4 is a plot of the measured carrier mobility of various samples of graphene versus the ratio D/G obtained from its Raman spectrum and generally illustrates the improvement in carrier mobility observed for graphene grown using neopentane for a given D/G ratio.

EXAMPLES

Sapphire wafers are positioned upon a silicon carbide-coated graphite susceptor within an MOCVD reactor chamber. The reactor chamber itself is protected in an inert atmosphere within a glovebox. The reactor is then sealed closed using a vacuum cavity which separates the reactor interior from the glovebox ambient by a double O-ring. The reactor is purged under a flow of nitrogen, argon or hydrogen gas at a rate of 10,000 to 60,000 sccm. The susceptor is rotated at a rate of 40 to 60 rpm. The pressure within the reactor chamber is reduced to 30 to 100 mbar. An optical probe is used to monitor the wafer reflectivity and temperature during growth—with the wafers still in their unheated state, they are rotated under the probe in order to establish a baseline signal. The wafers are then heated using resistive heater coils positioned beneath the susceptor to a setpoint of from 1100 to 1500° C. at a rate of 0.5 to 2.0 K/s. The wafers are optionally baked under flow of hydrogen gas for from 10 to 60 min, after which the ambient gas is switched to nitrogen or argon and the pressure is reduced to 30 to 50 mbar. The wafer is annealed at the growth temperature and pressure for a period of from 5 to 10 min, after which a hydrocarbon precursor is admitted to the chamber. This is transported from its liquid state in a bubbler by passing a carrier gas (nitrogen, argon or hydrogen) through the liquid which is held under constant temperature and pressure. The vapour enters a gas mixing manifold and proceeds to the reactor chamber through a showerhead via a multitude of small inlets commonly referred to in the art as plenums/plena, which guarantees uniform vapour distribution and growth across the surface of the wafers. The wafers are exposed to the hydrocarbon vapour under constant flow, pressure and temperature for a duration of 1,800 to 10,800 s at which point the precursor supply valve is shut off. The wafers are then cooled under continuing flow of nitrogen, argon or hydrogen gas at a rate of from 2 to 4 K/min. Once the wafer temperature reaches below 200° C., the chamber is pumped to vacuum and purged with inert gas. The rotation is stopped and the heaters are shut off. The reactor chamber is opened and the graphene-coated wafers are removed from the susceptor once the heater temperature reaches below 150° C.

The graphene formed was then characterised using standard techniques including Raman spectroscopy. The results obtained using 2,2,3-trimethylbutane and comparative results using n-hexane as hydrocarbon precursors are illustrated in FIGS. 2, 3A and 3B. The results demonstrate that graphene grown using a branched hydrocarbon precursor exhibits both a higher carrier mobility and reduced defect density when compared to graphene grown using a linear, straight chain hydrocarbon having only two methyl groups. The reduced defect density is confirmed by a significant reduction in the D/G and G/2D ratios of the characteristic bands in the Raman spectra of graphene.

Similarly, the inventors found that neopentane was unexpectedly advantageous over n-hexane in that the graphene exhibits a higher carrier mobility than would be expected, even when the graphene has a higher ratio of D/G in its Raman spectrum. That is, it is surprising that graphene produced from different precursors (such as linear and branched hydrocarbon precursors) can have a higher mobility when grown from branched precursors despite the similar or greater defect density as measured by Raman spectroscopy, and in spite of both precursors consisting of the same elemental composition, such carbon and hydrogen. As a result, the inventors have also found that there is greater flexibility afforded to the other process conditions when growing graphene from branched precursors, for example growth temperature, when targeting a minimum carrier density.

As used herein, the singular form of "a", "an" and "the" include plural references unless the context clearly dictates otherwise. The use of the term "comprising" is intended to be interpreted as including such features but not excluding other features and is also intended to include the option of the features necessarily being limited to those described. In other words, the term also includes the limitations of "consisting essentially of" (intended to mean that specific further components can be present provided they do not materially affect the essential characteristic of the described feature) and "consisting of" (intended to mean that no other feature may be included such that if the components were expressed as percentages by their proportions, these would add up to 100%, whilst accounting for any unavoidable impurities), unless the context clearly dictates otherwise.

The foregoing detailed description has been provided by way of explanation and illustration, and is not intended to limit the scope of the appended claims. Many variations of the presently preferred embodiments illustrated herein will be apparent to one of ordinary skill in the art, and remain within the scope of the appended claims and their equivalents.

The present invention will now be described further in the following clauses:

1. A method for manufacturing graphene, the method comprising:
   forming graphene on a non-metallic surface of a substrate by CVD in a CVD reaction chamber, wherein the step of forming graphene comprises introducing a precursor in a gas phase and/or suspended in a gas into the CVD reaction chamber;
   wherein the precursor consists of one or more compounds selected from a $C_4$-$C_{10}$ organic compound;
   wherein the organic compound is branched such that the organic compound has at least three methyl groups; and
   wherein the organic compound consists of carbon and hydrogen and, optionally, oxygen, fluorine, chlorine and/or bromine.

2. The method according to clause 1, wherein the precursor is a liquid at 20° C. and 1 bar of pressure.

3. The method according to clause 1 or clause 2, wherein the organic compound is saturated and/or acyclic.

4. The method according to any preceding clause, wherein the organic compound includes one or more oxygen atoms, each oxygen atom linking two carbon atoms.

5. The method according to any preceding clause, wherein the organic compound has one or more functional groups selected from a hydroxy group, a fluorine atom, a chlorine atom and a bromine atom.

6. The method according to any of clauses 1 to 3, wherein the organic compound consists of carbon and hydrogen such that the organic compound is a hydrocarbon, preferably an alkane, alkene and/or alkyne, more preferably an alkane.

7. The method according to any preceding clause, wherein the precursor comprises a branched organic compound having at least one tertiary carbon atom and/or at least one quaternary carbon atom, preferably at least two tertiary and/or quaternary carbon atoms.

8. The method according to clause 7, wherein the precursor consists of one or more compounds selected from a $C_5$-$C_{10}$ organic compound, preferably a $C_5$-$C_8$ organic compound; and wherein the organic compound has at least one tertiary carbon atom and/or at least one quaternary carbon atom, preferably at least two tertiary and/or quaternary carbon atoms.

9. The method according to clause 8, wherein the organic compound has at least four methyl groups.

10. The method according to any preceding clause, wherein the precursor consists of one or more compounds selected from a $C_6$-$C_{10}$ organic compound.

11. The method according to clause 10, wherein the $C_6$-$C_{10}$ organic compound has at least five methyl groups, preferably triptane.

12. The method according to any preceding clause, wherein the precursor consists of one organic compound.

13. The method according to any preceding clause, wherein the precursor is introduced into the CVD reaction chamber as a mixture with a carrier gas, preferably wherein the carrier gas is one or more of hydrogen, nitrogen, helium, and argon, more preferably wherein the carrier gas is one of nitrogen, helium and argon or a mixture of hydrogen and one of nitrogen, helium and argon.

14. The method according to any preceding clause, wherein the non-metallic surface of the substrate is silicon, silicon carbide, silicon oxide, silicon nitride, aluminium oxide, YSZ, $CaF_2$, and/or a III-V semiconductor.

The invention claimed is:

1. A method for manufacturing graphene, the method comprising:
   forming graphene directly on a non-metallic surface of a substrate by CVD in a CVD reaction chamber, wherein the step of forming graphene comprises introducing a precursor in a gas phase and/or suspended in a gas into the CVD reaction chamber;
   wherein the precursor consists of one or more compounds selected from a $C_5$-$C_{10}$ organic compound;
   wherein the organic compound is branched such that the organic compound has at least three methyl groups, and has at least one tertiary carbon atom and/or at least one quaternary carbon atom; and
   wherein the organic compound consists of carbon and hydrogen and, optionally, oxygen, fluorine, chlorine and/or bromine.

2. The method according to claim 1, wherein the precursor is a liquid at 20° C. and 1 bar of pressure.

3. The method according to claim 1, wherein the organic compound is saturated and/or acyclic.

4. The method according to claim 1, wherein the organic compound includes one or more oxygen atoms, each oxygen atom linking two carbon atoms.

5. The method according to claim 1, wherein the organic compound has one or more functional groups selected from a hydroxy group, a fluorine atom, a chlorine atom and a bromine atom.

6. The method according to claim 1, wherein the organic compound consists of carbon and hydrogen such that the organic compound is a hydrocarbon.

7. The method according to claim 1, wherein the precursor comprises a branched organic compound having at least two tertiary and/or quaternary carbon atoms.

8. The method according to claim 1, wherein the precursor consists of one or more compounds selected from a $C_5$-$C_8$ organic compound.

9. The method according to claim 8, wherein the organic compound has at least four methyl groups.

10. The method according to claim 1, wherein the precursor consists of one or more compounds selected from a $C_6$-$C_{10}$ organic compound.

11. The method according to claim 10, wherein the $C_6$-$C_{10}$ organic compound has at least five methyl groups.

12. The method according to claim 1, wherein the precursor consists of one organic compound.

13. The method according to claim 1, wherein the precursor is introduced into the CVD reaction chamber as a mixture with a carrier gas.

14. The method according to claim 1, wherein the non-metallic surface of the substrate is silicon, silicon carbide, silicon oxide, silicon nitride, aluminium oxide, YSZ, $CaF_2$, and/or a III-V semiconductor.

15. The method according to claim 8, wherein the organic compound has at least two tertiary and/or quaternary carbon atoms.

16. The method according to claim 11, wherein the organic compound is triptane.

* * * * *